United States Patent [19]

Querry et al.

[11] 4,206,420
[45] Jun. 3, 1980

[54] PHASE LOCKED LOOP WITH AUTOMATIC SWEEP

[75] Inventors: Lester R. Querry, Laurel; Ajay Parikh, Gaithersburg, both of Md.

[73] Assignee: Digital Communications Corporation, Gaithersburg, Md.

[21] Appl. No.: 960,394

[22] Filed: Nov. 13, 1978

[51] Int. Cl.² ............................................. H03B 3/04
[52] U.S. Cl. ............................................. 331/4; 331/17; 331/25
[58] Field of Search ........................... 331/4, 17, 18, 25

[56] References Cited

U.S. PATENT DOCUMENTS

| | | | |
|---|---|---|---|
| 3,935,541 | 1/1976 | Amend et al. | 331/4 |
| 4,039,966 | 8/1977 | Skinner | 331/4 |

Primary Examiner—Siegfried H. Grimm
Assistant Examiner—Edward P. Westin
Attorney, Agent, or Firm—Pollock, Vande Sande & Priddy

[57] ABSTRACT

An improved phase-locked loop includes a phase detector, active loop filter and a VCO, in conventional phase-locked loop relationship. In addition, a positive feedback path couples active loop filter output to active loop filter input. In the absence of loop lock, the positive feedback provided by the positive feedback path satisfies the conditions necessary for the production of an oscillating output from the active loop filter circuit. The oscillating output generated by this "oscillator" drives the VCO in a sweeping action allowing the loop to acquire signals outside of its normal capture range. On capture, phase detector output provides an additional negative feedback path which overrides the effect of the positive feedback path and therefore, oscillations cease and the loop locks. The positive feedback path can comprise a relatively simple passive frequency selective circuit.

3 Claims, 5 Drawing Figures

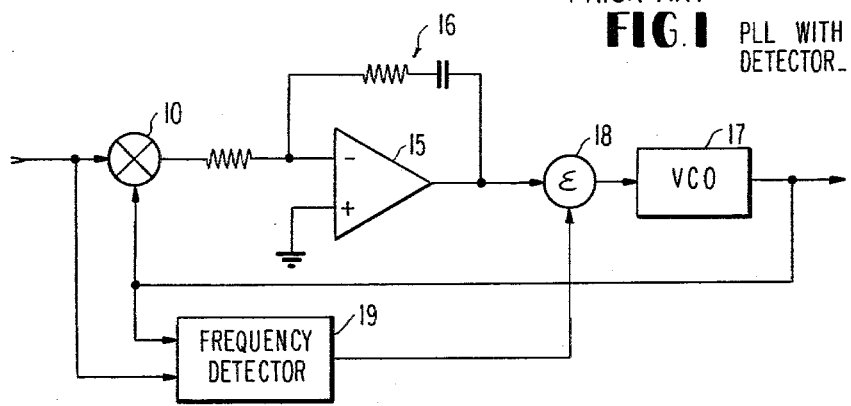
PRIOR ART
FIG. 1 PLL WITH FREQUENCY DETECTOR
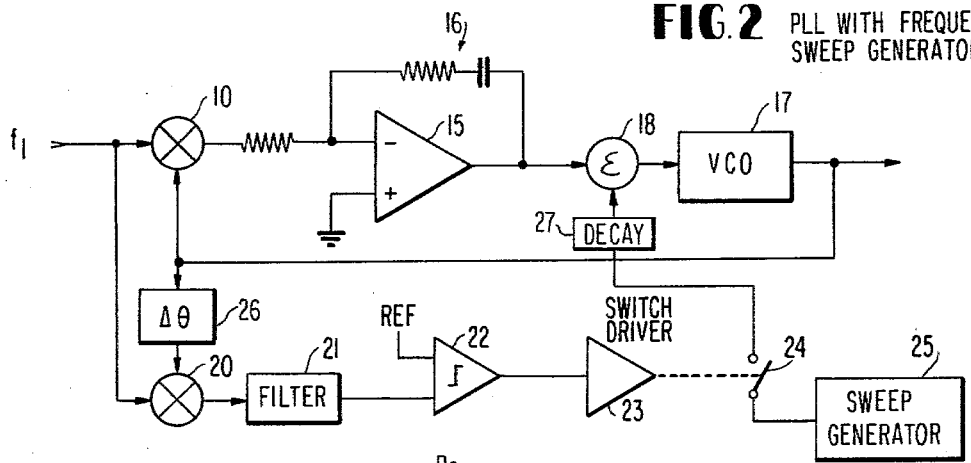
PRIOR ART
FIG. 2 PLL WITH FREQUENCY SWEEP GENERATOR
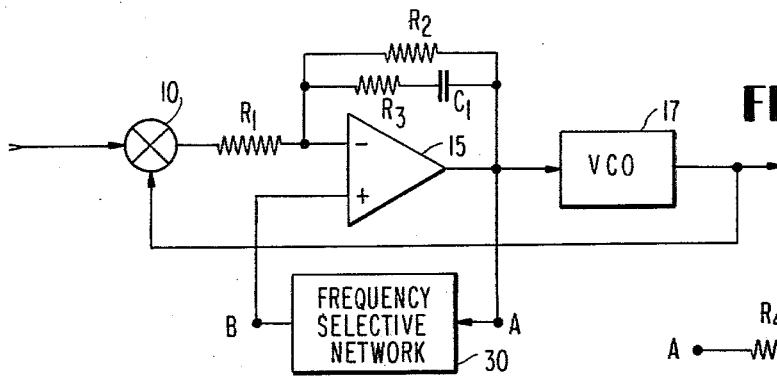
FIG. 3
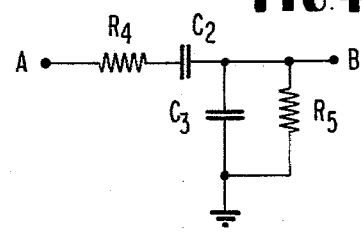
FIG. 4
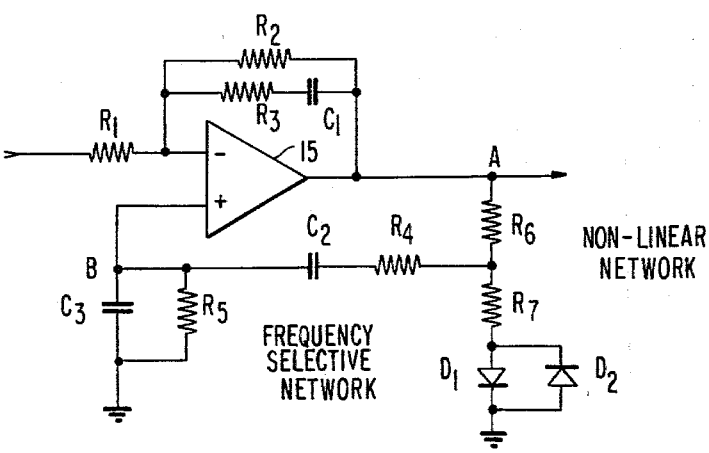
FIG. 5 OSCILLATOR CIRCUIT

PHASE LOCKED LOOP WITH AUTOMATIC SWEEP

FIELD OF THE INVENTION

The present invention relates to phase-locked loops, and more importantly, phase-locked loops capable of sweeping action necessary for acquisition of signals outside of the normal capture bandwidth of the loop.

BACKGROUND OF THE INVENTION

Phase-locked loop circuits are a well-established tool in the communications and control fields. Phase-locked loops can be designed for a wide variety of desired characteristics including specifically, natural frequency, i.e., the characteristic response frequency of the loop when phase-locked, capture bandwidth, i.e., the range of bandwidth over which the loop will lock onto an incoming signal, and many others. Unfortunately, several of these parameters are interrelated so that, typically, in the design of a phase-locked loop, trade-offs must be made. For example, jitter can be reduced and the loop stabilized, but only at the expense of decreasing the loop bandwidth. This limits the range of frequencies over which the loop can acquire a signal, that is, lock onto and track a signal. Thus, it is not always possible to design a phase-locked loop so that its bandwidth is wide enough to capture all signals of interest.

The art, however, has provided two different solutions to the problem of achieving phase lock of signals outside the capture range of the loop. Of the two available solutions, one moves the input signal frequency to within the capture range of the loop, and the other moves the capture range of the loop to the signal frequency. The latter function can be accomplished in at least two different ways, ie., by using a frequency detector to control the loop to achieve phase-lock, or by using a frequency sweep circuit to vary the VCO frequency toward the signal frequency. Either approach will cause the capture range to move toward the signal frequency to enable phase-lock. However, both techniques require considerable additional circuitry and have special control requirements for enabling and disabling them. For example, either the frequency detector or frequency sweep circuit must be disabled when phase-lock is achieved and re-enabled when phase-lock is lost, and very importantly, the circuits must be disabled in such a way as to maintain phase-lock.

In more detail, FIG. 1 shows the frequency detector approach referred to above. A conventional second-order phase-locked loop comprises a phase detector 10, an active loop filter comprising an operational amplifier 15 and filter network 16 and a VCO 17. The output of the VCO 17 forms one input to the phase detector 10, the other input is provided by the input signal, i.e., the signal to which it is desired to lock. The output of the active loop filter is coupled to the VCO by an adder 18. A second input of the adder 18 is provided by the frequency detector 19, which has two inputs, the first being the signal input, and the second being the output of the VCO 17. Frequency detector 19 has several stringent requirements. It typically requires a continuous, unmodulated, single-tone signal to operate, and must maintain proper phase alignment with the quadrature detector when in phase-lock.

The other approach to providing a relatively wide capture range for a loop with inherently narrow bandwidth is shown in FIG. 2 in which similar elements have similar reference characters. In addition to the conventional phase detector, active loop filter, and VCO, a control path comprising a phase shift circuit 26, a phase detector 20, filter 21, comparator 22, driver 23, switch 24 and decay circuit 27 are provided to couple the sweep generator to the adder. The control elements detect lack of lock to close the switch 24 and thus the VCO frequency is swept under control of the sweep generator 25. When lock is detected, the switch 24 must be opened to prevent overdriving the VCO and a decay circuit allows the active filter to slowly replace the sweep voltage acquisition level.

Either the prior approach shown in FIG. 1 or 2 requires the addition of several active elements, as well as careful design to insure that the additional elements are enabled and disabled at the proper time and in such a fashion as to insure that the overall phase-locked loop function is not interfered with.

It is an object of the present invention to provide a simplified self-sweeping phase-locked loop which consists essentially of passive components in addition to the conventional phase-locked loop. It is a further object of the present invention to provide a self-sweeping phase-locked loop which automatically enters and leaves the sweeping mode of operation and maintains loop lock when leaving the sweeping mode of operation. It is still another object of the present invention to provide a self-sweeping phase-locked loop which is relatively simple, inexpensive and can be designed to exhibit a wide variety of characteristics.

SUMMARY OF THE INVENTION

These and other objects of the invention are met by modifying a conventional phase-locked loop which includes a quadrature phase detector, active loop filter and VCO, the active loop filter including an operational amplifier and a negative feedback circuit providing the desired filter characteristics. The improved phase-locked loop includes the foregoing components as well as an additional positive feedback path in the active loop filter. By properly proportioning the parameters for the positive feedback circuit components, the loop filter becomes a low frequency oscillator when the loop is out-of-lock. The oscillating voltage at the output of the amplifier-oscillator is then able to drive the VCO over the desired frequency range and therefore moves the capture range toward the signal frequency. when phase-lock occurs, the phase detector provides, in essence, additional negative feedback which greatly exceeds the positive feedback whereupon, oscillation ceases and the phase detector, active loop filter and VCO operate in conventional phase lock fashion to maintain phase lock.

In addition to adding the positive feedback path, an additional negative feedback path is provided in the active loop filter to stabilize the amplifier gain in its active operating region.

BRIEF DESCRIPTION OF THE DRAWINGS

The invention will now be explained in such detail so as to enable those skilled in the art to make and use the same in connection with the following portions of the specification when taken in conjunction with the attached drawings in which like reference characters identify identical apparatus and in which:

FIG. 1 comprises a block diagram of a prior art phase-locked loop including a frequency detector, for enabling loop lock outside of the nominal loop capture range;

FIG. 2 is a block diagram of a prior art phase-locked loop including components to enable frequency sweeping to enable loop lock outside of the nominal loop capture range;

FIG. 3 is a block diagram of a phase-locked loop including sweeping components of the present invention;

FIG. 4 is a circuit diagram of an appropriate frequency selective network for use in connection with FIG. 3; and FIG. 5 illustrates the active loop filter with another positive feedback circuit that can be employed in accordance with the invention.

DETAILED DESCRIPTION OF A PREFERRED EMBODIMENT

FIG. 3 shows a phase detector 10, with two inputs, a first input at the left is input to the phase-locked loop carrying a signal which it is desired to lock onto. The output of the phase detector 10 is coupled to an active loop filter comprising operational amplifier 15, a resistor R1 coupling the output of the phase detector to the negative input terminal of amplifier 15, and a feedback network consisting of resistors R2 and R3 and a capacitor C1, connecting the output of amplifier 15 back to its negative input. Resistors R1 and R3 and capacitor C1 set the loop filter characteristics and resistor R2 provides DC feedback to keep the amplifier in its linear region when the loop is out of lock. The VCO 17 receives an output voltage from the amplifier 15, and couples a corresponding frequency back to another input of the phase detector 10. The foregoing components comprise a conventional phase-locked loop with an active loop filter. In order to provide the phase-locked loop with self-sweeping capability, the frequency selective network 30 has been added, coupling the output of the amplifier 15 to a positive input thereof.

In operation, when the loop is out of lock, there is no negative feedback path through the phase detector 10. By properly proportioning the parameters in the frequency selective network 30 to supply positive feedback at a predetermined center frequency, the active loop filter becomes a low frequency oscillator. The oscillating output voltage at the output of the amplifier 15 can then drive the VCO 17 over the desired frequency range to move the loop capture range toward the signal frequency. When phase lock occurs, the phase detector provides sufficient negative feedback to greatly exceed the positive feedback provided by the frequency selective network 30. Accordingly, when lock is achieved, oscillation ceases and the phase detector and VCO maintain phase lock in accordance with conventional phase-locked loop operation. In addition, the positive feedback adds to the open loop gain of the loop filter to further improve low frequency tracking performance.

FIG. 4 is a schematic of a suitable network for the frequency selective network 30.

As shown in FIG. 4, the input to the frequency selective network, i.e., terminal point A, is connected to a resistor R4 which is connected to a capacitor C2. The output of the capacitor C2 is connected to the output of the frequency selective network, i.e., circuit point B, and is also connected to a parallel RC combination made up of resistor R5 and capacitor C3 coupled to a suitable potential. With the frequency selective network shown in FIG. 4, coupled into the circuits shown in FIG. 3, there is a negative feedback path for the amplifier 15 consisting of the VCO 17, phase detector 10, and the loop filter components R1, R2, R3 and C1. There is also a positive feedback path consisting of the frequency selective circuit shown in FIG. 4. Oscillation can occur, in accordance with conventional theory, when positive feedback exceeds the negative feedback. When the loop is out of lock, there is no effective output from the phase detector and the positive feedback circuit causes the amplifier 15 to oscillate. When lock is achieved, the negative feedback provided by the enumerated components, provides a larger amount of feedback than that provided by the positive feedback circuit, oscillation ceases and phase-lock is maintained.

It is well known to those skilled in the art that the natural loop frequency ($f_n$) and damping factor ($\zeta$) during lock determine the capture bandwidth of a phase-locked loop. These same components determine the maximum allowable rate of frequency sweep to permit reliable lock up.

Gardener, in "Phase Lock Techniques" (John Wiley & Sons 1966) shows, in chapter 4-3, that for a high probability of lock (greater than 99%) the rate of frequency sweep (hereinafter defined as $\Delta fs$) must be less than half the natural loop frequency squared, for loops in which the damping factor is greater than 0.7. This can be stated mathematically as:

$$\Delta fs < \tfrac{1}{2}(f_n)^2 \tag{1}$$

For sinusoidal sweep, the maximum sweep rate ($\Delta fs_{max}$) is $2\pi$ times the peak frequency deviation required ($f_{pk}$) in one period of a sinusoid, i.e., ($1/f_0$) where $f_0$ is the frequency of oscillation. These statements are expressed mathematically as:

$$\Delta fs_{max} = \frac{2\pi(f_{pk})}{1/f_0} \tag{2}$$

$$f_0 = \frac{\Delta fs_{max}}{2\pi(f_{pk})} \tag{3}$$

By applying equation (1), the required frequency sweep rate is obtained and applied to equation (3) along with the peak frequency deviation required, which is typically fixed by the application. Peak frequency deviation is the worst case frequency difference between the VCO frequency and the frequency of the signal desired to be locked to. The result will be a numerical quantity for maximum sweep frequency to assure lock. The component values for the positive feedback network are then determined by $$f_0 = 1/2\sqrt{R4\ R5\ C2\ C3}$$

The ratio of R4 to R5 and C2 to C3 must be selected to insure the positive feedback through the positive feedback network exceeds the negative feedback through resistors R2 and R3 and capacitor C1.

FIG. 5 illustrates another embodiment of the frequency selective network and active filter (15 and 16) in which components in common with the circuit of FIG. 4 carry the same reference characters. It will be apparent that, in addition to the components of FIG. 4, the frequency selective network includes a non-linear portion comprising resistors R6, R7 and a parallel combination of oppositely poled diodes D2 and D1, with the resistor R4 coupled to the junction of resistors R6 and R7. The non-linear network provides amplitude stability to enable a near sine wave output by averaging the loop gain to approximately 1 at a particularly desired amplitude.

For circuits where the frequency sweeping covers a small range relative to the nominal loop capture range, i.e., the sweep frequency may be fast due to its low amplitude requirement, the circuit of FIG. 5 can be simplified by deleting C3 and employing C1 and R2 to implement the bandpass function along with R4, R5 and C2.

What is claimed is:

1. An improved phase locked loop for sweeping loop frequency in the absence of lock and for terminating sweeping action in the presence of lock comprising:

a phase detector, VCO and active loop filter, said phase detector having an output coupled to said active loop filter, said VCO having an input coupled to said active loop filter and an output coupled to said phase detector, passive feedback circuit means coupling an output of said active loop filter to an input thereof for generating an oscillating signal in the absence of loop lock, said active loop filter including an operational amplifier and a feedback circuit coupled between an output and a negative input of said operational amplifier, said passive feedback circuit means comprising a passive feedback circuit coupled between said output and a positive input of said operational amplifier.

2. The apparatus of claim 1 wherein said passive feedback circuit means includes a series RC circuit.

3. The apparatus of claim 1 or 2 wherein said passive feedback circuit means further includes a non-linear network comprising a pair of oppositely poled diodes, and serially connected thereto, a voltage divider, with said voltage divider coupled to said series RC circuit.

* * * * *